United States Patent
Conboy et al.

(10) Patent No.: US 6,308,107 B1
(45) Date of Patent: Oct. 23, 2001

(54) REALTIME DECISION MAKING SYSTEM FOR REDUCTION OF TIME DELAYS IN AN AUTOMATED MATERIAL HANDLING SYSTEM

(75) Inventors: Michael R. Conboy, Austin; Patrick J. Ryan, Kyle; Elfido Coss, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/387,175

(22) Filed: Aug. 31, 1999

(51) Int. Cl.[7] ..................................................... G06F 19/00
(52) U.S. Cl. ........................ 700/121; 414/937; 414/940; 700/112; 700/99
(58) Field of Search .................................. 700/121, 112, 700/113, 115, 116, 97, 99, 214, 228; 414/217, 939, 940, 937

(56) References Cited

U.S. PATENT DOCUMENTS

| | | | |
|---|---|---|---|
| 4,472,783 | * | 9/1984 | Johnstone et al. ................... 700/182 |
| 4,561,060 | * | 12/1985 | Hemond ............................... 700/113 |
| 4,665,492 | * | 5/1987 | Masters ................................ 700/119 |
| 4,708,574 | * | 11/1987 | Conboy et al. ...................... 414/591 |
| 4,827,423 | * | 5/1989 | Beasley et al. ....................... 700/96 |
| 5,231,585 | * | 7/1993 | Kobayashi et al. .................. 700/96 |
| 5,455,894 | * | 10/1995 | Conboy et al. ...................... 700/247 |
| 5,467,285 | * | 11/1995 | Flinn et al. ............................ 700/95 |
| 5,658,123 | * | 8/1997 | Goff et al. ........................... 414/786 |
| 5,835,377 | * | 11/1998 | Bush ...................................... 700/99 |
| 5,838,566 | * | 11/1998 | Conboy et al. ...................... 700/115 |
| 5,924,833 | * | 7/1999 | Conboy et al. ...................... 414/217 |
| 6,035,245 | * | 3/2000 | Conboy et al. ...................... 700/214 |
| 6,108,585 | * | 8/2000 | Ryan et al. ........................... 700/112 |
| 6,157,866 | * | 12/2000 | Conboy et al. ...................... 700/121 |

\* cited by examiner

Primary Examiner—William Grant
Assistant Examiner—Ronald D Hartman, Jr.

(57) ABSTRACT

A method for pre-positioning routed material in a computer controlled manufacturing arrangement having alternate locations for predetermined ones of a plurality of manufacturing process steps and predetermined types of materials to be routed into alternate locations. The method includes establishing a distribution of events indicative of the alternate locations at which material is processed for a manufacturing process step with respect to the materials to be routed and documenting the distribution of events in a database with respect to the type of materials to be routed and the alternate locations in terms of routing times, therein establishing a historical routing time for the type of material to be routed. In addition, there is established the actual mix of materials to be routed to the alternate locations and their historical routing time and actual routing time for the type of routed material are compared. Further, one of a plurality of substates is selected that include: pre-position routed material when historical and actual times are substantially the same, hold routed material when the times are different and re-route material when time comparison is not available. Finally, one of a plurality of alternate locations is selected to which to route the material for the next manufacturing process step as a function of a one of the substates.

11 Claims, 8 Drawing Sheets

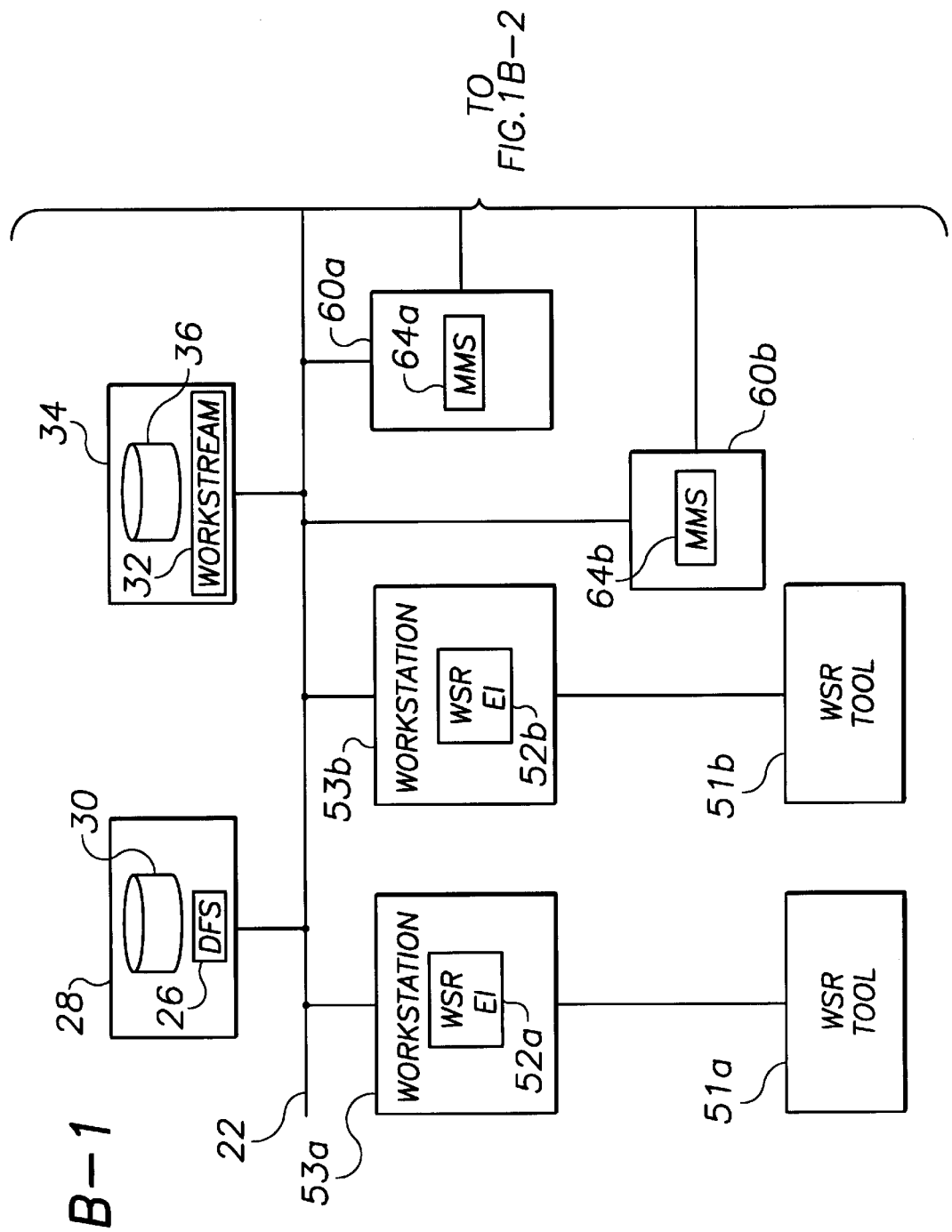

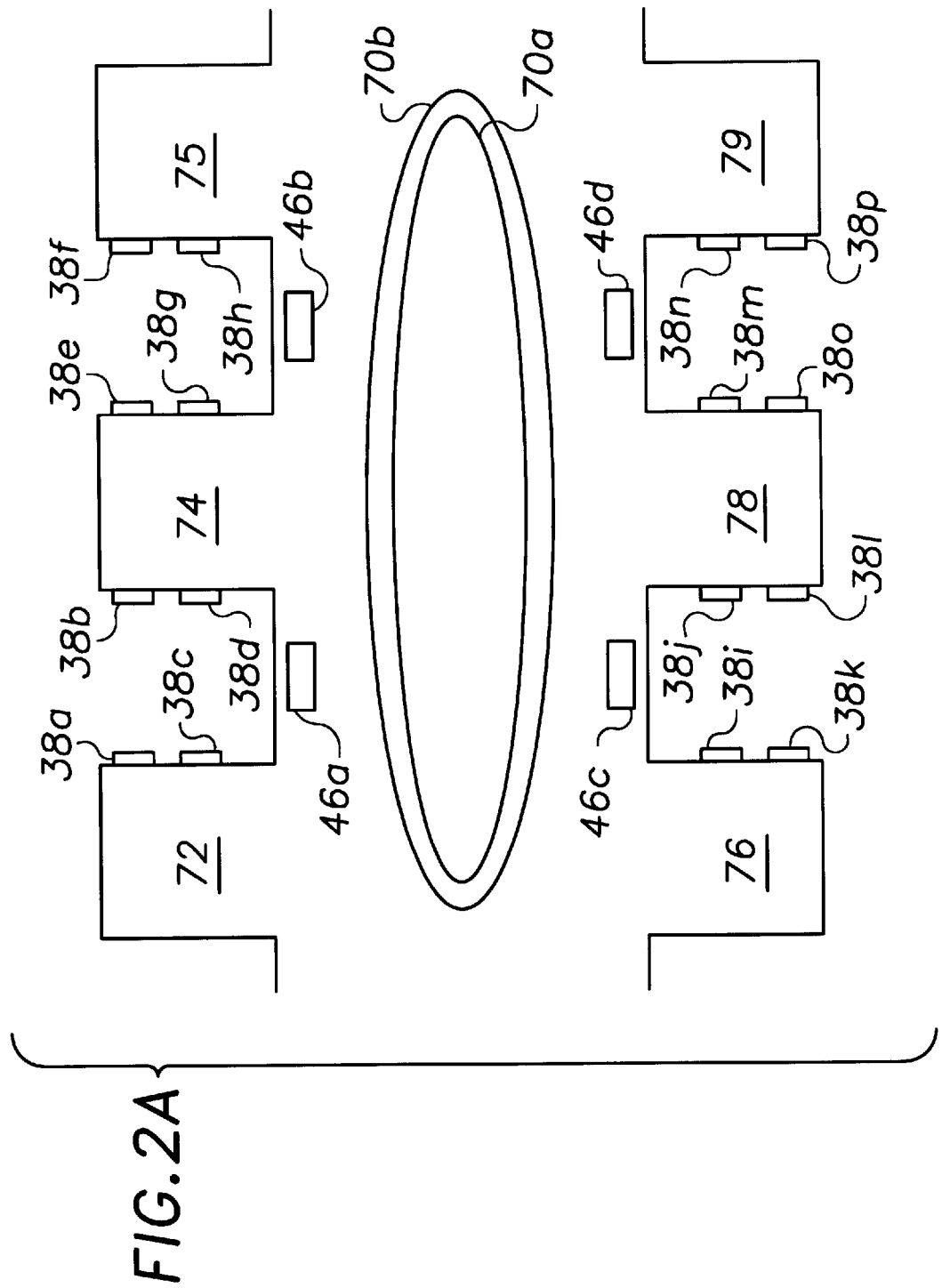

HISTORICAL REMOVAL TABLE 302

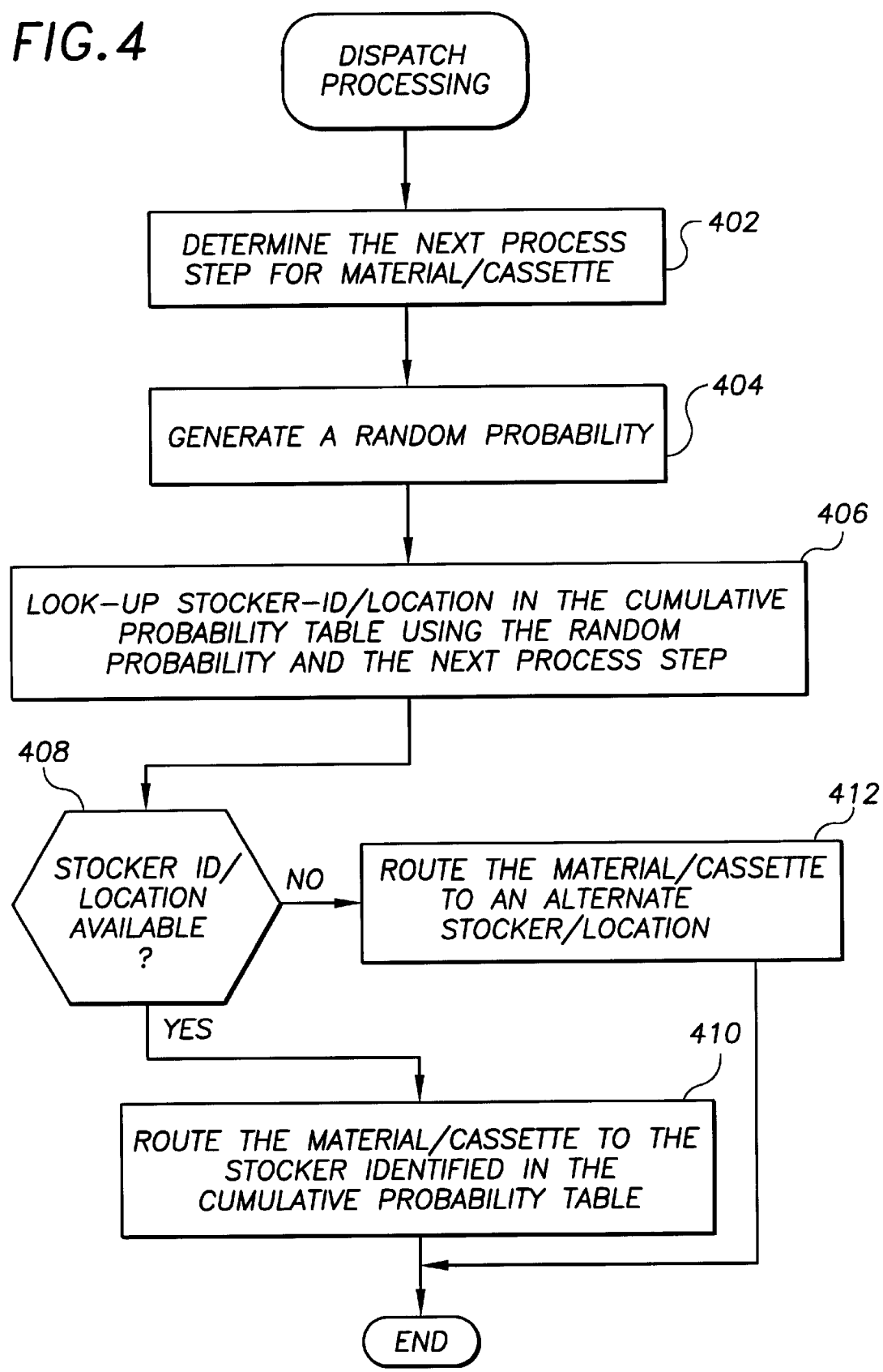

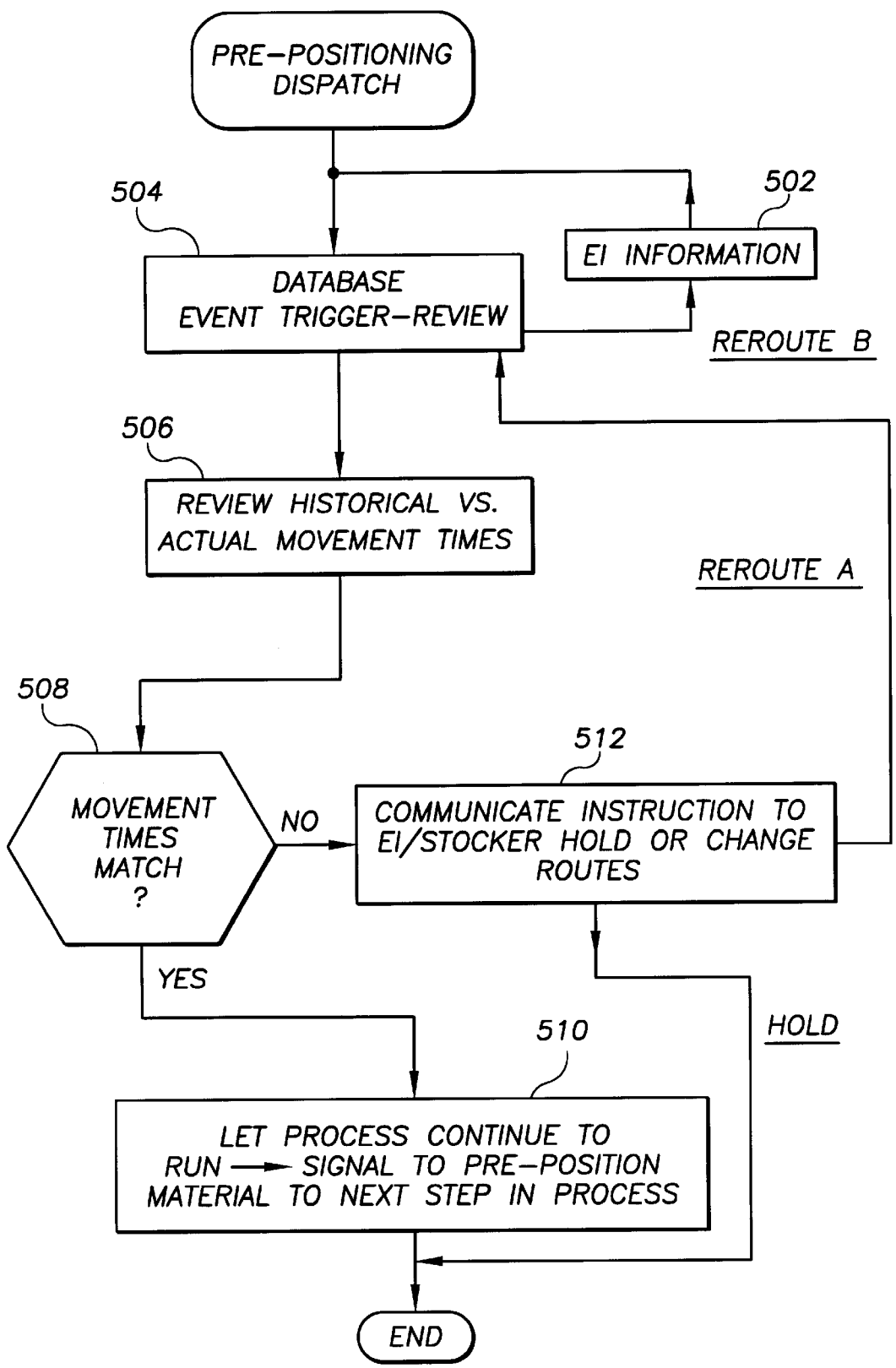

REALTIME DECISION MAKING SYSTEM FOR REDUCTION OF TIME DELAYS IN AN AUTOMATED MATERIAL HANDLING SYSTEM

RELATED APPLICATIONS

This application is related to co-pending applications, entitled "Scheduling Method for Automated Work Cell Transfer System", Ser. No. 09/387,174, filed on Aug. 31, 1999, "Managing Test Material in an Automated Material Handling System", Ser. No. 09/387,613 also filed on Aug. 31, 1999 and "Probabilistic Dispatching Method and Arrangement," filed on Dec. 12, 1997, having Ser. No. 08/990,059.

FIELD OF THE INVENTION

The present invention generally relates to automated material handling systems and, more particularly, to a system and a method for reducing transportation time delays via a real time decision making system as part of an automated material handling systems.

BACKGROUND OF THE INVENTION

Automated material handling systems are used in a variety of industries to move various materials from one location to another location. Semiconductor fabrication facilities, in particular, commonly utilize automated material handling systems for fabricating integrated circuits on semiconductor wafers.

A conventional semiconductor fabrication plant typically includes multiple fabrication areas or bays interconnected by a path, such as a conveyor belt. Each bay generally includes the requisite fabrication tools (interconnected by a subpath) to process semiconductor wafers for a particular purpose, such as photolithography, chemical-mechanical polishing, or chemical vapor deposition, for example. Material stockers or stocking tools generally lie about the plant and store semiconductor wafers waiting to be processed. The wafers are usually stored in cassettes each of which typically hold up to 25 wafers. A lot is a logical grouping of wafers in a cassette. The lot can migrate from cassette to cassette as it progresses through the chain of production processes Each material stocker typically services two or more bays and can hold hundreds of cassettes.

Once a lot has been retrieved, and the equipment has been set up, the operation on the wafers by a particular piece of equipment, or "tool," can begin. At this point, the lot is moved-in to the operation. This state is indicated to the host application by the operator for the lot. The lot remains in this state until the operation is completed. Once the operation is completed, the operator must perform tests and verifications on the wafers. When all tests and verifications have been performed, the host computer application program must be notified. Wafers may have moved from one cassette to another as a result of the operation. The host application has to be notified of this. The operator then places the cassette of "moved-out" wafers in the material stocker, to await orders as to the location of the next piece of equipment that will perform operations on the wafers.

Some present material handling systems exhibit excess movement of materials through the system that negatively impacts manufacturing throughput. In an example system, there are multiple locations that are available for a particular manufacturing process step. However, the system only provides mappings for one location per manufacturing process step. Therefore, the system does not know that there are alternate locations available for performing the processing step. When the AMHS dispatches material to a particular location, and the stocker associated with that location is unavailable, the material is redirected to an adjacent stocker or temporary storage. If other locations are available to perform the processing step, a move request is required to transfer the material from a stocker, such as the adjacent stocker, to the desired location. The AMHS then moves the material to the stocker at the specified location, and the material is then removed and processed.

The semiconductor fabrication plant, including the bays, material stockers and the interconnecting path, typically operates under control of a distributed computer system running a factory management program, such as Work-Stream Open sold by Consilium, Inc. In this environment, the automated material handling system (AMHS) may conceptually include the cassettes, the transportation system (e.g., paths) and control system (e.g., the distributed computer system). You may also have an empty carriers management system as well as a separate test wafer management system that form part of the AMHS. Currently these are handled as subsystems and must be manually coordinated by the operators on the line, which has led to delays in the system in processing the wafers. It would be desirable, therefore, to reduce processing delays and increase throughput efficiency by pre-positioning material at the different stocker locations through the use of current automated material handling systems.

SUMMARY OF THE INVENTIONS

Semiconductor fabrication facilities have material handling systems that manage production and test wafers as well as empty carriers separately throughout the system. Currently these are handled as subsystems and must be manually coordinated by the operators on the line, which has led to delays in the system in processing the wafers. It would be desirable to have an automated and integrated system to reduce delays due to products not being pre-positioned at a particular process location just before the prior lot is finished. It would be also desirable to have advanced notice of a downstream change in the system due to a malfunction or upstream command that will have a lot idling at a stocker location when it could have been re-routed where there is available capacity.

An example embodiment of the present invention is directed to a method for pre-positioning routed objects in a computer controlled manufacturing arrangement having alternate locations for predetermined ones of a plurality of manufacturing process steps and predetermined types of objects to be routed into alternate locations. The method includes establishing a distribution of events indicative of the alternate locations at which the object is processed for a manufacturing process step with respect to the objects to be routed and documenting the distribution of events in a database with respect to the type of objects to be routed and the alternate locations in terms of routing times, therein establishing a historical routing time for the type of object to be routed. In addition, there is established the actual mix of objects to be routed to the alternate locations and their historical routing time and an actual routing time for the type of routed objects are compared. Further, one of a plurality of substates is selected that include: pre-position routed objects when historical and actual times are substantially the same, hold routed object when the times are different and re-route object when time comparison is not available. Finally, one of a plurality of alternate locations is selected to which to route the object for the next manufacturing process step as a result of a one of the substates selected.

Another example embodiment of the present invention is directed to an apparatus for routing objects in a computer controlled manufacturing arrangement having alternate locations for predetermined ones of a plurality of manufacturing process steps and predetermined types of objects to be routed into alternate locations. The apparatus includes a mechanism for establishing a distribution of events indicative of the alternate locations at which object is processed for a manufacturing process step with respect to the objects to be routed and a mechanism for documenting the distribution of events in a database with respect to the type of objects to be routed and the alternate locations in terms of routing times, therein establishing a historical routing time for the type of object to be routed. The apparatus further includes a mechanism for establishing the actual mix of objects to be routed to the alternate locations and a mechanism for comparing historical routing time with actual routing time for a type of routed object. A mechanism is included that selects one of a plurality of substates that include: pre-position routed object when historical and actual times are substantially the same, hold routed object when the times are different and re-route object when comparison is not available and another mechanism is included that selects one of a plurality of alternate locations to which to route the object for the next manufacturing process step as a result of a one of the substates selected.

In accordance with another embodiment of the present invention there is described an automated manufacturing arrangement for routing objects between locations in a factory floor. The arrangement includes an object movement mechanism and a plurality of stockers coupled to the rail and arranged to transfer objects to and from the rail, each stocker providing temporary storage of objects for a manufacturing process step at a respective location, and at least one manufacturing processing step is performed at alternate locations. The arrangement further includes a data processing system coupled to the stockers and configured and arranged to record a distribution of events in a database with respect to the type of materials to be routed and the alternate locations in terms of routing times, therein establishing a historical routing time for the type of object to be routed. The system compares historical routing time with actual routing time for a type of routed object and selects one of a plurality of substates that include: pre-position routed objects when historical and actual times are substantially the same, hold routed objects when the times are different and re-route object when comparison is not available. The system then selects one of a plurality of alternate locations to which to route the object for the next manufacturing process step as a result of a one of the substates selected.

The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 2A is a schematic diagram showing the physical layout of a shop floor;

FIG. 4 is a flowchart of an example method for dispatching materials to a location in the plant, using a probability table; and FIG. 5 is a flowchart of an example method for pre-positioning materials to a location in the plant.

Figure 1A:
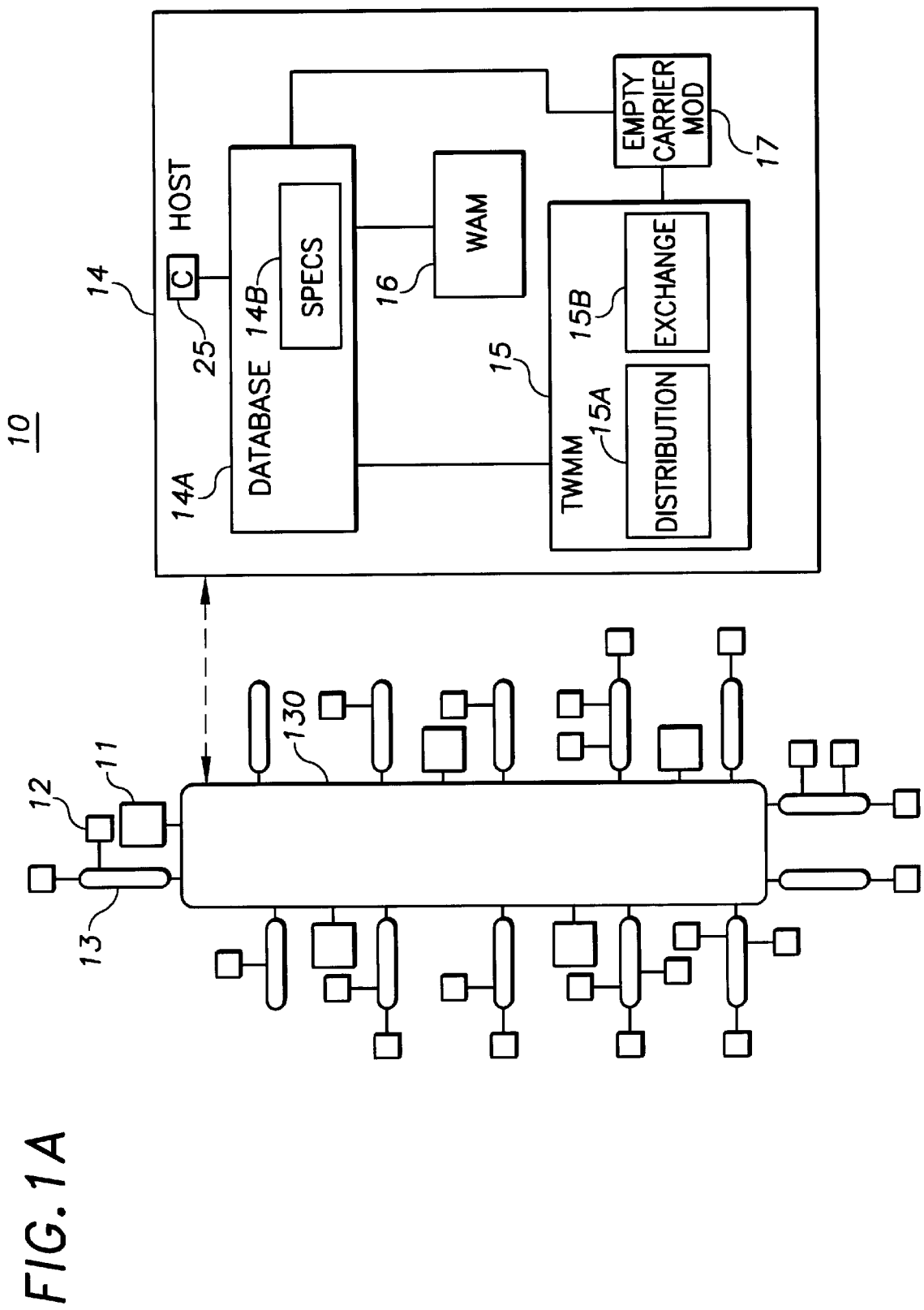
FIG. 1A illustrates an exemplary semiconductor fabrication facility in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention generally directed to a method and system for directing the movement of material in a manufacturing environment, particularly where an automated material handling system is used. The invention is particularly suited for managing production and test wafers in a semiconductor fabrication facility. While the present invention is not so limited, a better understanding of the invention will be found by reading the detailed description and exemplary embodiments that follow. Moreover, while the exemplary embodiment relates to a semiconductor facility processing wafers, it should be appreciated that the invention is not so limited.

In an example embodiment, there is described a method for prepositioning positioning routed material in a computer controlled manufacturing arrangement having alternate locations for predetermined ones of a plurality of manufacturing process steps and predetermined types of materials to be routed into alternate locations. The method includes establishing a distribution of events indicative of the alternate locations at that material is processed for a manufacturing process step with respect to the materials to be routed and documenting the distribution of events in a database with respect to the type of materials to be routed and the alternate locations in terms of routing times, therein establishing a historical routing time for the type of material to be routed. In addition, there is established the actual mix of materials to be routed to the alternate locations and their historical routing time and actual routing time for the type of routed material are compared. Further, one of a plurality of substates is selected that include: pre-position routed material when historical and actual times are substantially the same, hold routed material when the times are different and re-route material when time comparison is not available. Finally, one of a plurality of alternate locations is selected to which to route the material for the next manufacturing process step as a function of a one of the substates.

FIG. 1A illustrates an exemplary semiconductor fabrication facility in accordance with an illustrative embodiment of the invention. The semiconductor fabrication facility 10 generally includes multiple stocking tools or stockers 11 and multiple fabrication tools 12 and an automated material handling system for moving material (e.g., wafers) between the tools. The example automated material handling system includes one or more paths 13 interconnecting the tools and a host system 14 which controls the movement of material within the facility. The host system 14 typically is a distributed computer system running a factory management program, such as WorkStream Open. The fabrication and stocker tools and path(s) each typically include or are associated with a computer system which locally controls the operation of the tool or path and which communicates with the host system 14.

A number of different fabrication tools may be provided for fabricating wafers. While not exhaustive, such fabrication tools include, deposition chambers, polishing tools, photolithography tools, for example. The facility further includes a number of wafers, including production wafers and test wafers, and a number of cassettes for storing wafers processed in the facility. During processing, production wafers are typically divided into lots of one or more wafers. Each cassette and wafer or wafer lot typically includes an identification tag, such as a bar code, which may be read by each tool and/or path for identifying the cassette and wafer or wafer lot.

The term production wafer is used herein to describe semiconductor wafers on which actual products (e.g., integrated circuits) are being formed. The term test wafer is used herein to generally refer to non-production wafers used during fabrication. Such non-production or test wafers may, for example, be used for calibration, filling, particle counting, etc. In addition, the term cassette is not to be read narrowly. Rather, it is intended that the term cassette extend to cover any type of container used to hold material in an automated material handling system.

The host system 14 typically includes a memory management, such as a database 14A, for storing information pertaining to the fabrication process. The database 14A may reside on the host system 14 as shown or, alternatively, may reside on a separate system. The database 14A typically stores the number of wafer lots being started at a particular time, the time of each wafer start, and the associated process sequence specification 14B for each wafer start. Each process sequence specification 14C details a series of process steps under which a wafer lot undergoes during fabrication. Typically, a number of different process sequence specifications are in operation at a given time. The host system 14 accesses the specification(s) 14B to manage the flow of wafers within the facility. As should be appreciated, a given wafer lot undergoes a number of events during its fabrication sequence. Such events include, for example, dopant implants, various dielectric and metal deposition steps, polishing steps, storage in stockers, transfers between cassettes and so forth.

The host system 14 may further include a wafer attribute module (WAM) 16 which manages attributes of wafers as they move through their fabrication sequence. WAM 16 generally stores and updates attributes of wafers as they undergo events during fabrication. The attributes for each wafer are typically stored in a memory arrangement, such as the database 14A, and maintained by WAM 16. A more detailed discussion of wafer attribute management may be found in co-pending application Ser. No. 09/193,349, entitled "Managing a Semiconductor Fabrication Facility Using Wafer Lot and Cassette Attributes," filed Nov. 17, 1998, the contents of which are herein incorporated by reference. Cassette attributes may also be maintained to logically zone cassettes.

The host system 14 further includes a test wafer management (WWM) module 15 for managing wafers in the facility. The wafer management module 15, in the exemplary embodiment, includes a distribution module 15A, having access to the process sequence specifications 14A, for handling distribution of wafers in cassettes and an exchange module 15B which handles wafer exchanges between cassettes and the various tools around the facility. An empty carrier module 17 is included coupled to wafer module 15 to coordinate use and need of empty carriers in the system. A controller 25, within host system 14 and coupled to database 14a, is included for pre-positioning material on the line. The host system 14 and modules 15 and 16 may be implemented in a number of different ways. The implementation of the modules as a subcomponent of the host system 14 is provided by way of illustration only. The modules 15 and 16 may, alternatively, be implemented as stand alone modules that interface with the host system 14. A number of other implementation techniques will be readily understood by one skilled in the art upon reading the present description.

Figures 1, 1B, 2:
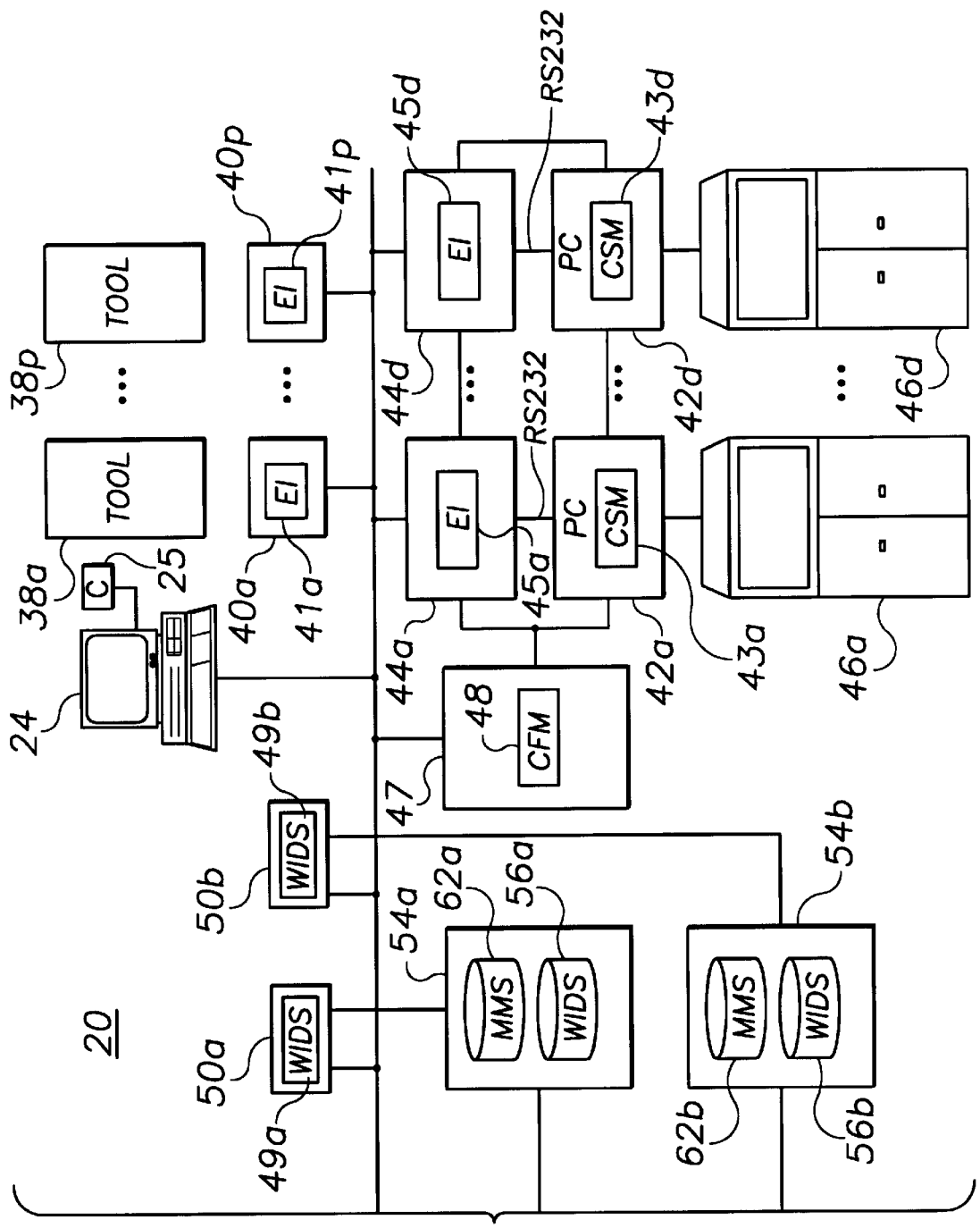
FIG. 1B is a schematic diagram depicting the architecture of a control system for the fabrication of integrated circuits.

Referring to the architecture of the control system, FIG. 1B refers generally to a control system 20 for the fabrication of integrated circuits on semiconductor wafers. The control system 20 has a central bus 22 to which the various control elements are coupled. The language, or protocol used on the bus 22 is called ISIS and is sold by ISIS Distributed Systems. A personal computer 24 is coupled to the bus 22 for ad hoc access to all movement functions for the cassettes and wafers. The controller/dispatcher 25 is coupled to control system 20 which, in this example embodiment is coupled to computer 24, functions to pre-position material in the process in anticipation of the next process step to reduce transportation time delays. In another example embodiment, controller 25 may be substituted for a software program within computer 24 or may be an external mechanism that is remotely coupled to system 20 (via 2-way wireless communication). Controller 25 and its function will be described in more detail later in the specification.

A distributed factory system (DFS) computer program 26 sold by Consilium, Inc. is resident on a UNIX workstation 28. The UNIX workstation 28 connects to the bus 22 for controlling, by use of the DFS 26, the manufacturing process of the wafers. The DFS 26 does this by tracking the handling of wafers by logical lots. A database 30 for use by the DFS 26, for supplying the needed information to the DFS 26, is also resident on the workstation 28. The database 30 is also supplied by Consilium, Inc. with the DFS 26. The program 32 is resident on a UNIX workstation 34, which is also used to control the manufacturing process of the wafers. A database 36 for use by the WorkStream program 32, for supplying the needed information to the WorkStream program 32, is also resident on the workstation 34. The database 36 is supplied by Consilium, Inc. with the WorkStream program 32.

Tools 38a through 38p used in the manufacturing process of the semiconductor wafers are coupled to the bus 22 via Hewlett Packard work stations 40a through 40p, running equipment interface ("EI") programs 41a through 41p, respectively. The equipment interface programs 41a through 41p function as translators between the language of the tools and the ISIS language of the bus 22.

CSM computers 42a through 42d are coupled to the bus 22 via Hewlett Packard work stations 44a through 44d, running equipment interface ("EI") programs 45a through 45d, respectively. The CSMs 43a–d of computers 42a–d are coupled to the EIs 45a–d of computers 44a via a SECS II protocol and RS232 connections between computers 42a–d and 44a–d, respectively. In an example embodiment, each stocker 46a–d is controlled by a separate CSM computer 42a–d. In another embodiment, one CSM computer controls up to three stockers. The computers 42a–42d run Sunsoft's "Interactive UNIX" as an operating system, and CSM application programs 43a through 43d, licensed by Daifuku. The computers 42a–42d are inter-coupled to each other via an ethernet. CFM program 48 on computer 47 is coupled to and controls all the CSM computers 42a–42d. Computer 47 is also coupled to the bus 22. The CFM program 48 functions as a global database manager for the CSMs 43a–d and passes misdirected messages to the correct object.

The computers 42a–42d schedule movement of the cassettes in and out of material stockers, schedule movement of the cassettes on an overhead cassette monorail, and keep track of all the cassettes in each stocker, and the lot numbers assigned to each stocker. Because of these functions which they perform, the personal computers 42a–42d are referred to as clean stocker managers (CSM). Four material stockers 46a through 46d connect to the personal computers 42a–42d for storing empty cassettes and cassettes of wafers. Note that CSMs 43a–d are shown in a distributed environment. In an alternate embodiment, a single centralized CSM can be configured and arranged to control all the stockers. Selection of a distributed versus a centralized CSM depends upon particular manufacturing requirements.

When a lot is entered into a stocker, for example stocker 46a, the cassette identifier containing the lot is read and the information is forwarded from the CSM 43a to the appropriate one of DFS computers 28 or 34 via EI 45a. The DFS then looks up the next operation and destination for the lot. Note that present DFSs, as exemplified by DFS 26 and WorkStream 32, only identify a single next destination and operation. The next operation and destination are forwarded to the CSM 43a, at which time CSM 43a performs its own selection of a destination (stocker) where there are multiple destinations at which the designated operation may be performed. A record is kept of destinations (stockers) from which lots are removed for performing respective operations. As a function of the record of removal events, CSMs 43a–d select next destinations according to the most likely destinations at which lots will be removed for performing the operations, respectively.

Two wafer ID servers (WIDS) 49a, 49b, that are computer programs resident on UNIX workstations 50a, 50b, respectively, maintain information regarding the wafers in WIDS databases 56a, 56b respectively. Databases 56a, 56b are resident on UNIX workstations 54a, 54b, respectively. The WIDS 49a, 49b maintain in the databases 56a, 56b wafer IDs, positions of the wafers within the cassettes, and the process steps through which each wafer passes. The WIDS database 56a is a backup database to the WIDS database 56b, for providing redundancy.

Wafer sorters (WSR) 51a, 51b are tools that move wafers within and/or between cassettes. They also verify the identity of wafers and cassettes, sort wafers, and split and merge lots. The WSR 51a, 51b are coupled to the bus 22 via WSR equipment interface programs 52a, 52b, respectively, resident on Hewlett Packard workstations 53a, 53b, respectively. The WSR equipment interface programs 52a, 52b act as translators between the language of the WSR 51a, 51b and the ISIS language of the bus 22. Two workstations 60a, 60b are coupled to the bus 22 and to the workstations 54a, 54b, for access to MMS databases 62a, 62b. The two MMS databases 62a, 62b contain the original cassette IDs, the colors of the cassettes (zone restrictions), cassette tags, lots-to-tags mapping, and configuration information regarding the stockers 46. The two MMS databases 62a, 62b are also used to validate the cassette Ids. In an alternate embodiment, the two MMS databases 62a, 62b are extensions of the Workstream database 36.

The two MMS programs 64a, 64b, mesh the two WIDS 49a, 49b and the two MMS databases 62a, 62b with the DFS program 26 and with the WorkStream program 32, using the ISIS bus protocol. The MMS programs 64a, 64b, allow a requester to retrieve a cassette tag or ID for a given lot ID, or retrieve a lot ID for a given cassette ID. The MMS programs 64a, 64b, provide facilities for accessing lot and carrier data for shop floor control, provide protocols to external entities to facilitate movement of the wafers on the shop floor, provide user interfaces for ad-hoc use by operators, and are sensitive to time-out values when interacting with the equipment interfaces 45a through 45d.

Figure 2B:
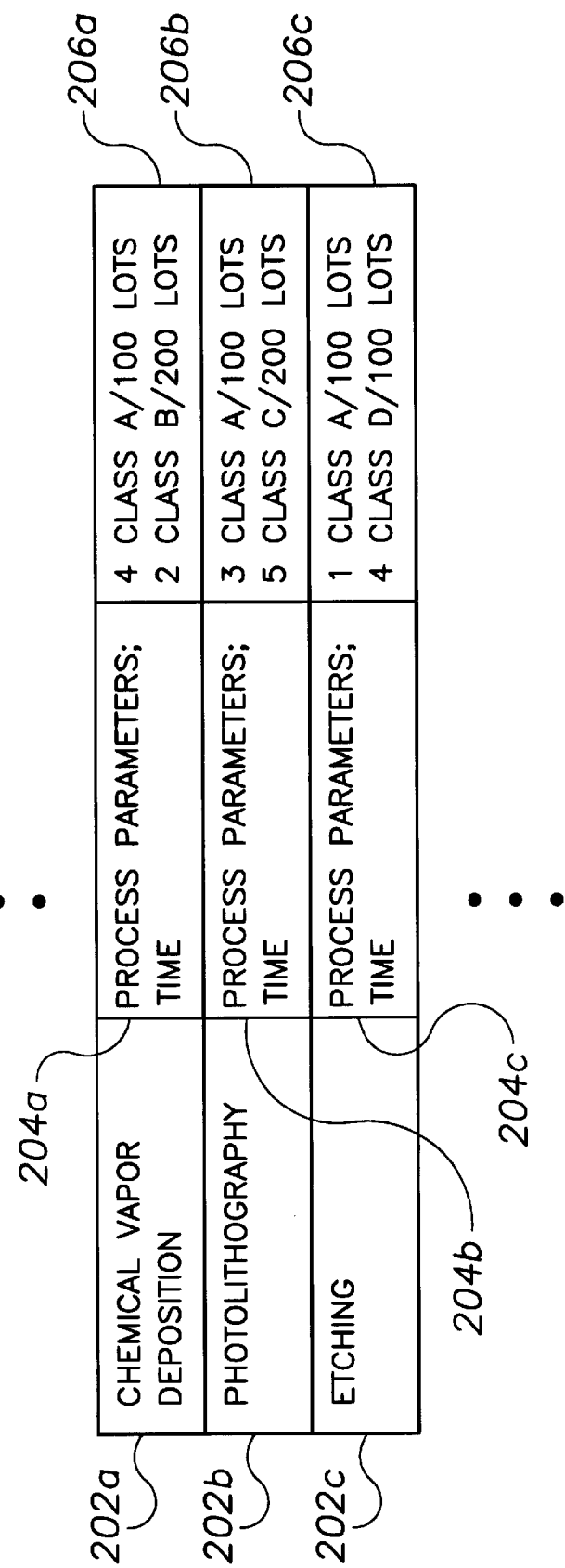
FIG. 2B illustrates an exemplary portion of a process sequence specification in accordance with an embodiment of the invention.

Referring to FIG. 2A, monorails 70a, 70b carry the cassettes to and from the stockers 46a–d. The tools 38a–38p are located at bays 72, 74, 75, 76, 78, and 79. Monorails 70a–b and stockers 46a–d are conventional. FIG. 2B illustrates a portion of an exemplary process sequence specification 200. As will be appreciated, the process sequence specification 200 if shown in its entirety would include a much larger number of process steps. The exemplary specification 200 includes a number of process step specifications 202a–202c. Each process step specification 202a–c includes information 204a–c for carrying out the process step. This information includes, inter alia, the tool(s) used, the processing parameters for each tool, and the time for completing the process step. The time may be provided as a flow rate (e.g., X production wafers/hour). The flow rate parameter is typically predetermined based on prior history of the process step, for example. Each process step specification further includes a field 206a–c identifying the number and class of wafers, if any, which are needed to perform the process step.

The distribution module 15A can access the specification(s) running over a period of time to determine a distribution of production and test wafers and empty carriers over time. The distribution module typically determines the number of production wafers being started under a particular fabrication sequence and the timing of the wafer starts over a time period; this may be done by querying the database 14A. As will be appreciated, groups of production wafers are typically started at different time intervals. Using the number of production wafer starts, the timing thereof, and the corresponding process sequence specifications the distribution module estimates the time at which each step during each fabrication sequence will be carried out. Using these time estimates, the distribution module determines a wafer time profile for each particular class of wafers. The wafer time profiles may be determined through the end of each process sequence specification or for predetermined time period (e.g., 3 months). intervals, for example, of one hour.

Figure 3:
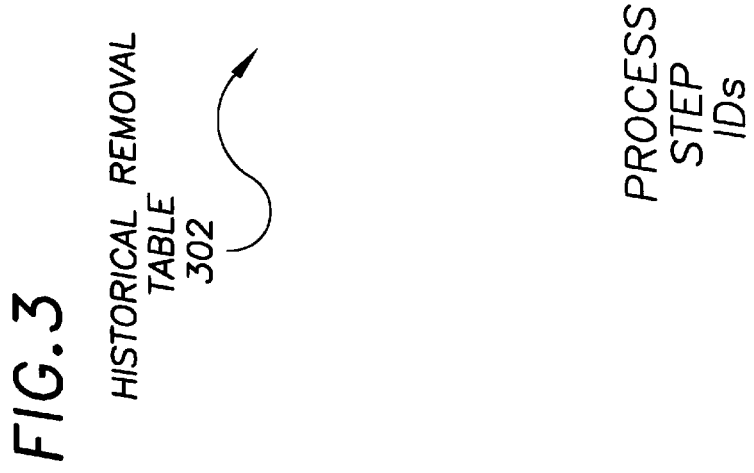
FIG. 3 illustrates an example historical removal table.

FIG. 3A illustrates an example historical removal table 302 that captures data by stocker locations and by process. The historical removal table 302 is a two-dimensional array having columns that are indexed by stocker IDs/locations and rows that are indexed by process step IDs. Over a predetermined duration, each entry in the historical removal table 302 contains the total number of removal events for the indexing process step ID and stocker ID/location. For example, for process step ID 3 at stocker ID/location 1, the entry in the historical removal table 302 contains the total number of times that material was removed from stocker ID/location 1 and process step 3 was performed on that material. In one method, material movement in an AMHS is directed as a function of historical move request information. AMHS stocker locations from which material is removed and the associated process step for the move request are captured. The information is stored in a table having indices for stocker IDs/locations and indices for process steps.

Entries in the historical removal table are updated in the following manner. When material is removed from a stocker for performing a process step thereon, the event is added to an entry in the historical removal table for the particular stocker and process step. After each event, the distribution of removal of material from stockers and process steps as set forth in the historical removal table is converted to data for a cumulative probability table. Alternatively, the data from the historical removal table may be converted to the cumulative probability table periodically. A more detailed discussion of capturing this data in historical tables may be found in co-pending application Ser. No. 08/990,059, entitled "Probabilistic Dispatching Method and Arrangement," filed Dec. 12, 1997, which is herein incorporated by reference.

FIG. 4 is a flowchart of an example method for dispatching material to a stocker/location for further processing. When material is returned to the AMHS, the next process step for the material must be determined, as shown by block 402. At block 404, a random probability value, between zero and one, is generated. The process step identifier from block 402 and the random probability from block 404 are used to identify a stocker ID in the cumulative probability table. If, for example, process step 1 is identified, and an example generated random probability value is 0.37, stocker ID/location 3 is selected. Stocker ID/location 3 is selected because for process step 1, the generated random probability of 0.37 is greater than or equal to the cumulative probability of 0.20 for stocker ID/location 2 and less than the cumulative probability of 0.60 for stocker ID/location 3. Continuing now at block 408, if the stocker ID/location is available, control is directed to block 410, and the material is routed to the identified stocker ID/location. If, however, the stocker ID/location identified at block 406 is not available, control is directed to block 412. At block 412, an alternate stocker/location is selected, and the material is routed thereto.

Events in the process, that are normally captured in historical tables, can be triggered down the line (equipment malfunction, etc.) or can be triggered up the line at the management level of the control system 20 (change order, quality issue, etc.). This information is communicated through EIs 45 (equipment interfaces) typically at the stocker locations (FIG. 1B) that serve as the link between the process line and the control system. The capture of movement data in historical tables and the dispatching of material to and from stocker locations is normally stored in database 14A. Database 14A also serves as an inventory of information about the material movers (carriers or cassettes) in the system, whether or not they are empty, the move history of the carriers (i.e., source and destination locations), cassette ID, and time associated with each move in the system. Database 14A is maintained based on the event information received by the control system through EI s 45. Each change or new event should trigger a review of the data in database 14A of the status of the process via a pre-position controller/dispatcher 25 that is coupled to control system 20. Controller 25 forms part of host system 14 and is coupled to database 14A as well. A computer program residing in computer 24 of control system 20 would be one example of an external computer arrangement that is coupled to system 20 by any method that will allow 2-way communication (see FIG. 1B).

Such a review of database information by controller 25 would allow for pre-positioning of wafers, production or test, or empty carriers at the different stocker locations to reduce the transportation time delays. For example, using historical data, it is known when a processing step on a wafer is about to finish since it goes through a countdown. Since we know historically how long it takes for the stocker to release the next wafer lot and travel time, it can be triggered to release ahead of time, thereby pre-positioning the lot at the next process location as the previous lot is being released. Referring to FIG. 5, if for example, a lot is scheduled to be released into the production line, the mix of objects to be routed and pre-positioned is first determined. The system will receive a trigger signal advising of one of the selected conditions: an event change in the manufacturing process (such as the next process step has a problem (shutdown, logjam,etc.)) or a process timer countdown from one of the process locations. Once such an event occurs, this triggers an event change 502 at that process location that is communicated via a signal from one of EI s 45 back to database 14A, which in turn triggers a review 504 by controller 25 of database 14A to determine status of the entire line 506 (review of historical times per process or location versus actual time that is being spent on the line). If the times match at decision 508, then the process continues 510 with a pre-positioning signal being sent to the appropriate/designated EI assigned to a particular stocker location.

If the times do not match 512, then Controller 25 signals the designated EI to HOLD, as in hold the material, or REROUTE A in which case a request is made to review the database and process to determine to where the material should be rerouted. Signal REROUTE B is sent to EI upon determination that a new route has been found and the material and then sent to be pre-positioned at the next stocker location, before its released from its current stocker location. In summary, controller 25 selects from one of a plurality of substates that include: pre-position routed object when historical and actual times are substantially the same, hold routed object when the times are different and reroute object when comparison is not available. Then the controller selects one of a plurality of alternate locations to which to route the object for the next manufacturing process step as a result of one of the substates selected. The system is on standby until another event is signaled through one of the EI s. This system includes the ability to select another one of the plurality of alternate locations to which to pre-position the object for the next manufacturing process step if the one alternate location is unavailable. In the past, the lot would have to be routed to a stocker location closest to the operation since it had already been released from a previous stocker location without knowledge of the problem downstream.

Some sample points that can be used as events are: 1) time to probable extraction; 2) need to pull an empty and the type of empty needed; 3) time to trigger a pull in the system; 4) how long has a lot been sitting at a stocker location; 5) countdown time, based on history, at a particular process or stocker location; 6) an actual delay in the system; 7) time it takes to pre-position a wafer; and 8) last step in pre-positioning. Controller 25 can also use events combined with time for each operation (historically known and statistically calculated) to prioritize the pre-positioning or triggering of certain events. Controller 25 will work to coordinate systems that currently deal with the management of empty cassettes as well as integrating the test wafer operations into the mainline production.

In the example where a countdown timer is used as a basis for a trigger for delivering an item (material or a cassette for example), the timer is based on the operation of the various manufacturing processes. As the different processes proceed, the probability that a material transfer is needed increases. Historical data including the time that it takes a manufacturing process to finish, along with an established distribution of events associated with the manufacturing process can be used to determine probability. If the process malfunctions, the probability goes to zero and does not change until the process resumes. If the process cannot proceed, the probability may be reduced as the historical time is cycled through several times for comparison to determine what is occurring at a particular location. Alternatively, if the process cannot proceed and new material or object is necessary to resume processing, the probability may be increased to reflect the immediate or impending need for additional material.

Using historical data, such as the time it takes for objects to be transferred and the time it a takes for manufacturing process to finish, a threshold probability for the need for material is defined. As the timer counts down, the probability that material transfer is needed approaches the threshold probability. When the probability reaches the threshold, the routing decision is made. An advantage of using a timer in formulating a pre-positioning instruction involves the determination of which of several manufacturing processes to prepare a material transfer for. In a semiconductor manufacturing process, there may be four empty wafer cassettes in a pool. When more than four processes will need a material transfer, timer for each process and related probabilities generated can be used to make a decision as to where to route each of the empty wafer cassettes. The processes having one of the four highest probabilities will be sent an empty wafer carrier first, based upon which one reaches a threshold probability level first.

As noted above, the present invention is applicable to a number of techniques for managing test material in an automated material handling system based. Accordingly, the present invention should not be considered limited to the particular examples described above, but rather should be understood to cover all aspects of the invention as fairly set out in the attached claims. For instance, while the management of test wafers in an automated material handling systems of a semiconductor facility is illustrated, the invention extends to cover other the management of different types of test material in different environments. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A method for routing objects in a computer controlled manufacturing arrangement having alternate locations for predetermined ones of a plurality of manufacturing process steps and predetermined types of objects to be routed into alternate locations, comprising the steps of:
    establishing a distribution of events indicative of the alternate locations at which object is processed for a manufacturing process step with respect to the objects to be routed;
    documenting the distribution of events in a database with respect to the type of objects to be routed and the alternate locations in terms of routing times, therein establishing a historical routing time for the type of object to be routed;
    establishing an actual mix of objects to be routed to the alternate locations;
    comparing historical routing time with an actual routing time for the routed object;
    selecting one of a plurality of substates that include: pre-position routed object when historical and actual times are substantially the same, hold routed object when the times are different and re-route object when comparison is not available; and
    selecting one of a plurality of alternate locations to which to route the object for the next manufacturing process step as a result of one of the substates selected.

2. The method of claim 1, further comprising the step of selecting another one of the plurality of alternate locations to which to pre-position the object for the next manufacturing process step if the one alternate location is unavailable.

3. The method of claim 1, wherein the types of objects is a combination of the following: semiconductor material and cassettes.

4. The method of claim 1, wherein the method further includes, after establishing the mix step, receiving a trigger signal advising of one of the selected conditions: an event change in the manufacturing process or a process timer countdown.

5. The method of claim 4, further including defining a threshold probability level as a function of the plurality of manufacturing processes; and determining a probability as a function of the established distribution of events and the plurality of manufacturing processes.

6. An apparatus for routing objects in a computer controlled manufacturing arrangement having alternate locations for predetermined ones of a plurality of manufacturing process steps and predetermined types of objects to be routed into alternate locations, comprising:
    means for establishing a distribution of events indicative of the alternate locations at which object is processed for a manufacturing process step with respect to the objects to be routed;
    means for documenting the distribution of events in a database with respect to the type of objects to be routed and the alternate locations in terms of routing times, therein establishing a historical routing time for the type of object to be routed;
    means for establishing an actual mix of objects to be routed to the alternate locations;
    means for comparing historical routing time with actual routing time for a type of routed object;
    means for selecting one of a plurality of substates that include: preposition routed object when historical and actual times are substantially the same, hold routed object when the times are different and re-route object when comparison is not available; and
    means for selecting one of a plurality of alternate locations to which to route the object for the next manufacturing process step as a result of a one of the substates selected.

7. The apparatus of claim 6, further comprising means for selecting another one of the plurality of alternate locations to which to route the object for the next manufacturing process step if the one alternate location is unavailable.

8. The apparatus of claim 6, wherein the types of objects is a combination of the following: semiconductor material and cassettes.

9. The apparatus of claim 6, wherein the apparatus further includes means for receiving a trigger signal advising of one of the selected conditions: an event change in the manufacturing process or a process timer countdown.

10. The apparatus of claim 6, wherein the apparatus further includes means for defining a threshold probability level as a function of the plurality of manufacturing processes; and means for determining a probability as a function of the established distribution of events and the plurality of manufacturing processes.

11. An automated manufacturing arrangement for routing objects between locations in a factory floor, comprising:

an object movement mechanism;

a plurality of stockers coupled to a rail and arranged to transfer objects to and from the rail, each stocker providing temporary storage of an object for a manufacturing process step at a respective location, and at least one manufacturing processing step is performed at alternate locations; and a data processing system coupled to the stockers and configured and arranged to record a distribution of events in a database with respect to the type of objects to be routed and the alternate locations in terms of routing times, therein establishing a historical routing time for the type of object to be routed, and to compare historical routing time with actual routing time for a type of routed object and to select one of a plurality of substates that include: pre-position routed object when historical and actual times are substantially the same, hold routed object when the times are different and re-route object when comparison is not available and to select one of a plurality of alternate locations to which to route the object for the next manufacturing process step as a result of a one of the substates selected.

* * * * *

UNITED STATES PATENT AND TRADEMARK OFFICE
CERTIFICATE OF CORRECTION

PATENT NO. : 6,308,107 B1
DATED : October 23, 2001
INVENTOR(S) : Conboy et al.

It is certified that error appears in the above-identified patent and that said Letters Patent is hereby corrected as shown below:

<u>Title page,</u>
ABSTRACT, line 23, after "function of" please delete "a".

<u>Column 1,</u>
Line 43, after "processes" please insert -- . --.

<u>Column 8,</u>
Line 3, "Workstream", should read -- WorkStream --.
Line 52, after "(e.g., 3 months)" please delete ".".

<u>Column 10,</u>
Line 15, "logjam,etc." should read -- logjam, etc. --.

Signed and Sealed this

Nineteenth Day of March, 2002

Attest:

JAMES E. ROGAN
*Director of the United States Patent and Trademark Office*

*Attesting Officer*